United States Patent
Yim et al.

(10) Patent No.: US 9,806,289 B2
(45) Date of Patent: Oct. 31, 2017

(54) ORGANIC LIGHT-EMITTING DISPLAY APPARATUS

(71) Applicant: SAMSUNG DISPLAY CO., LTD., Yongin-si, Gyeonggi-do (KR)

(72) Inventors: Sanghoon Yim, Suwon-si (KR); Dongchan Kim, Gunpo-si (KR); Wonjong Kim, Suwon-si (KR); Eungdo Kim, Seoul (KR); Dongkyu Seo, Hwaseong-si (KR); Okkeun Song, Hwaseong-si (KR); Jihye Lee, Incheon (KR); Dahea Im, Incheon (KR); Yoonhyeung Cho, Yonginsi (KR); Wonsuk Han, Yongin-si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 15/144,848

(22) Filed: May 3, 2016

(65) Prior Publication Data
US 2017/0047379 A1   Feb. 16, 2017

(30) Foreign Application Priority Data
Aug. 13, 2015 (KR) .................. 10-2015-0114873

(51) Int. Cl.
*H01L 29/08* (2006.01)
*H01L 51/52* (2006.01)
(Continued)

(52) U.S. Cl.
CPC ...... *H01L 51/5253* (2013.01); *H01L 27/3244* (2013.01); *H01L 51/5275* (2013.01); *H01L 27/3211* (2013.01); *H01L 29/4908* (2013.01); *H01L 51/0545* (2013.01); *H01L 51/504* (2013.01); *H01L 51/5237* (2013.01); *H01L 51/5281* (2013.01)

(58) Field of Classification Search
CPC ............... H01L 27/326; H01L 27/3211; H01L 51/5218; H01L 51/5237; H01L 51/0545; H01L 51/541; H01L 51/05012; H01L 21/775; H01L 29/4908; B82Y 10/10
USPC ............ 257/40, 59, 72, 79, 98, 99, E51.018, 257/E29.068; 438/82, 99, 128, 149
See application file for complete search history.

(56) References Cited

U.S. PATENT DOCUMENTS

2010/0213449 A1* 8/2010 Yamamoto .......... H01L 27/3283
257/40
2012/0056174 A1* 3/2012 Kim .................... H01L 27/3227
257/43

FOREIGN PATENT DOCUMENTS

KR    10-1334529 B1    11/2013
KR    10-1503313 B1    3/2015
(Continued)

*Primary Examiner* — Thinh T Nguyen
(74) *Attorney, Agent, or Firm* — Lee & Morse, P.C.

(57) ABSTRACT

An organic light-emitting display apparatus, including a substrate; a first electrode on the substrate; a second electrode on the first electrode; a first organic emissive layer between the first electrode and the second electrode, the first organic emissive layer to emit a first light; a second organic emissive layer between the first electrode and the second electrode, the second organic emissive layer to emit a second light having a different color from the first light; an auxiliary layer on the second electrode, the auxiliary layer having a refractive index equal to or higher than about 2.2; and a charging layer on the auxiliary layer.

20 Claims, 6 Drawing Sheets

(51) Int. Cl.
     *H01L 29/49*           (2006.01)
     *H01L 51/05*           (2006.01)
     *H01L 27/32*           (2006.01)
     *H01L 51/50*           (2006.01)

(56) References Cited

FOREIGN PATENT DOCUMENTS

| | | |
|---|---|---|
| KR | 10-1528242 B1 | 6/2015 |
| KR | 10-2017-0029037 A | 3/2017 |
| WO | WO 2011/043083 A1 | 4/2011 |

\* cited by examiner

ORGANIC LIGHT-EMITTING DISPLAY APPARATUS

CROSS-REFERENCE TO RELATED APPLICATION

Korean Patent Application No. 10-2015-0114873, filed on Aug. 13, 2015, in the Korean Intellectual Property Office, and entitled: "Organic Light-Emitting Display Apparatus," is incorporated by reference herein in its entirety.

BACKGROUND

1. Field

The present disclosure herein relates to an organic light-emitting display apparatus.

2. Description of the Related Art

An organic light-emitting display apparatus may include an organic light-emitting element that may include an anode electrode, an organic emissive layer, and a cathode electrode. The light-emitting element may emit light by energy generated when an exciton, which may be a bound state of an electron and an electron hole, which may be attracted to each other in the organic emissive layer, falls from an excited station to a ground state, and the organic light-emitting display apparatus may display a certain image by using such light emission.

SUMMARY

Embodiments may be realized by providing an organic light-emitting display apparatus, including a substrate; a first electrode on the substrate; a second electrode on the first electrode; a first organic emissive layer between the first electrode and the second electrode, the first organic emissive layer to emit a first light; a second organic emissive layer between the first electrode and the second electrode, the second organic emissive layer to emit a second light having a different color from the first light; an auxiliary layer on the second electrode, the auxiliary layer having a refractive index equal to or higher than about 2.2; and a charging layer on the auxiliary layer.

A thickness of the auxiliary layer may be about 280 Å to about 400 Å.

The auxiliary layer may include a transmissive or semi-transmissive material.

The auxiliary layer may include copper iodide.

The second electrode may have a silver content of about 50% or more.

A thickness of the second electrode may be less than or equal to about 100 Å.

The organic light-emitting display apparatus may further include an encapsulation substrate on the charging layer. The encapsulation substrate may cover the first electrode, the first organic emissive layer, the second organic emissive layer, the auxiliary layer, and the charging layer.

The organic light-emitting display apparatus may further include a polarizer on the encapsulation substrate. The polarizer may perform circular polarization on an incident light.

The first light and the second light may be mixed to generate a white light.

The first light may be a blue light and the second light may include a red light and a green light.

Average reflectivity of red, green, and blue from a bottom surface of the second electrode, a contact surface between the second electrode and the auxiliary layer, and a top surface of the auxiliary layer may be less than or equal to about 15%.

Reflectivity of the blue from the bottom surface of the second electrode, the contact surface between the second electrode and the auxiliary layer, and the top surface of the auxiliary layer may be higher than reflectivity of each of the red and the green from the bottom surface of the second electrode, the contact surface between the second electrode and the auxiliary layer, and the top surface of the auxiliary layer.

The first light may be a blue light and the second light may be a yellow light.

The first electrode may bean anode and the second electrode is a cathode, and a portion of the first light and a portion of the second light may pass through the second electrode.

A distance between the first electrode and the second electrode may be a resonance distance of the first light, and a distance between the first electrode and the second electrode may be different from a resonance distance of the second light.

The distance between the first electrode and the second electrode may be about 3000 Å to about 5000 Å.

The organic light-emitting display apparatus may further include a charge generation layer between the first and second organic emissive layers.

The organic light-emitting display apparatus may further include a third organic emissive layer to emit a third light having a different color from the first light and the second light.

Embodiments may be realized by providing an organic light-emitting display apparatus, including a substrate; a first electrode on the substrate; a second electrode on the first electrode; a first organic emissive layer between the first electrode and the second electrode, the first organic emissive layer to emit a first light; a second organic emissive layer between the first electrode and the second electrode, the second organic emissive layer to emit a second light having a different color from the first light; an auxiliary layer on the second electrode, the auxiliary layer having a refractive index equal to or higher then about 2.2, the auxiliary layer having a thickness of about 280 Å to about 400 Å; an encapsulation substrate on the auxiliary layer, the encapsulation substrate covering the first organic emissive layer, the second organic emissive layer, and the auxiliary layer; and a charging layer between the auxiliary layer and the encapsulation substrate, the charging layer being in contact with the auxiliary layer and the encapsulation substrate.

The second electrode may have a silver content of about 50% or more, and a thickness of the second electrode may be less than or equal to about 100 Å.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
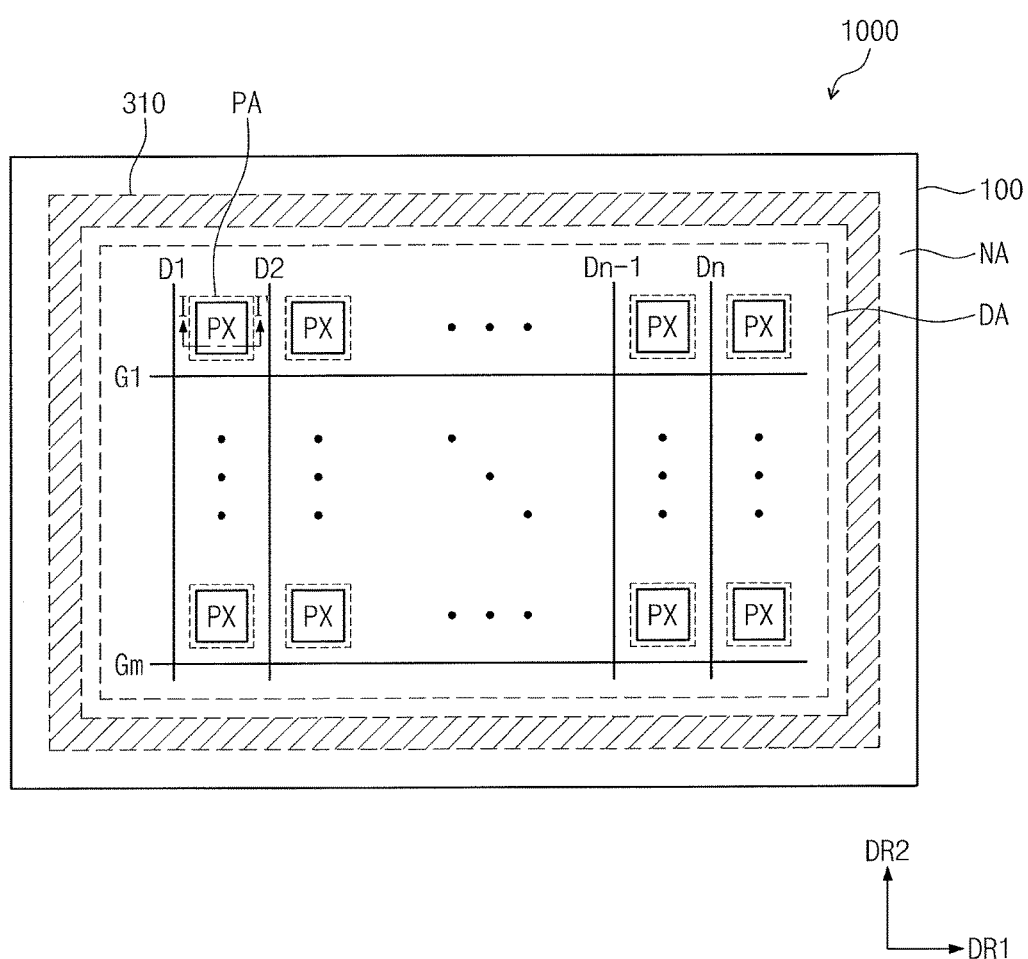
FIG. 1 illustrates a schematic plan view of an organic light-emitting display apparatus.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
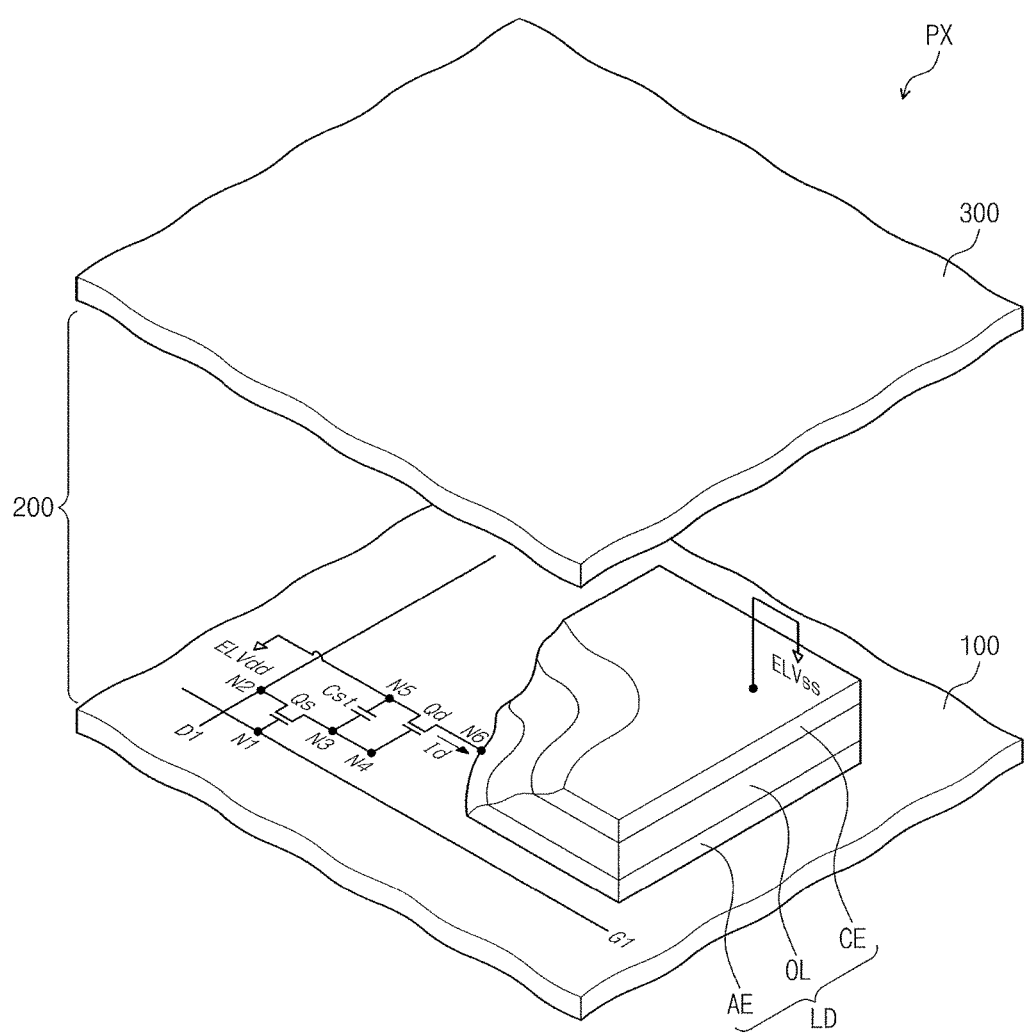
FIG. 2 illustrates a conceptual view of a single pixel shown in FIG. 1.

FIG. 1 illustrates a schematic plan view of an organic light-emitting display apparatus 1000, and FIG. 2 illustrates a conceptual view of a single pixel shown in FIG. 1.

Referring to FIG. 1, the organic light-emitting display apparatus 1000 may include a substrate 100, a pixel layer 200, and an encapsulation substrate 300.

The substrate 100 may include a display area DA that may display an image, and a non-display area NA that may be adjacent to the display area DA and may not display an image. The display area DA may include a plurality of pixel areas PA.

The substrate 100 may be a flexible substrate and may be made of plastic having good heat resistance and durability, such as, for example, polyethyleneetherphthalate, polyethylenenaphthalate, polycarbonate, polyarylate, polyetherimide, polyethersulfone, and polyimide. In an embodiment, the substrate 100 may be made of various materials, such as metal or glass.

A barrier layer may be disposed between the substrate 100 and the pixel layer 200 in order to prevent an external foreign material, such as moisture or oxygen, from penetrating an organic light-emitting element LD through the substrate 100.

The pixel layer 200 may be disposed between the substrate 100 and the encapsulation substrate 300. The pixel layer 200 may include a plurality of gate lines G1 to Gm, a plurality of data lines D1 to Dn, and a plurality of pixels PX. The gate lines G1 to Gm may be insulated from the data lines D1 to Dn and cross them. FIG. 1 illustrates, for example, that the gate lines G1 to Gm are extended in a first direction DR1 and the data lines D1 to Dn are extended in a second direction DR2 crossing the first direction DR1. In an embodiment, when the gate lines G1 to Gm are insulated from the data lines D1 to Dn and cross them, each of the gate lines G1 to Gm and the data lines D1 to Dn may have a partially bent shape, not a straight line shape. The gate lines G1 to Gm and the data lines D1 to Dn may define pixel areas PA.

The pixels PX may be disposed on the pixel areas PA, respectively. Each of the pixels PX may be connected to one of the gate lines G1 to Gm and to one of the data lines D1 to Dn to display an image. Each of the pixels PX may display, for example, one of red, green, and blue colors. In an embodiment, each of the pixels may display other colors (e.g., a white color) excluding the red, green and blue colors. FIG. 1 illustrates that each of the pixels PX has, for example, a quadrilateral shape. In an embodiment, the shape of each of the pixels PX may have various shapes, such as a polygon, a circle, or an ellipse.

FIG. 2 illustrates a single pixel connected to the first gate line G1 and to the first data line D1.

Referring to FIG. 2, the pixel PX may include a switching transistor Qs, a driving transistor, Qd, a storage capacitor Cst, and an organic light-emitting element LD.

The switching transistor Qs may include a control terminal N1, an input terminal N2, and an output terminal N3. The control terminal N1 may be connected to the first gate line G1, the input terminal N2 may be connected to the first data line D1, and the output terminal N3 may be connected to the driving transistor Qd. The switching transistor Qs may output a data voltage applied to the first data line D1 to the driving transistor Qd in response to a gate signal applied to the first gate line G1.

The driving transistor Qd may include a control terminal N4, an input terminal N5, and an output terminal N6. The control terminal N4 may be connected to the output terminal N3 of the switching transistor Qs, the input terminal N5 may receive a driving voltage ELVdd, and the output terminal N6 may be connected to the organic light-emitting element LD. The driving transistor Qd may output to the organic light-emitting element LD an output current Id that varies in size according to a voltage between the control terminal N4 and the output terminal N6.

The storage capacitor Cst may be connected to between the output terminal N3 of the switching capacitor Qs and the input terminal N5 of the driving transistor Qd. The storage capacitor Cst may charge a data voltage applied to the control terminal N4 of the driving transistor Qd and may maintain the charged data voltage for a certain time after the switching transistor Qs is turned off.

The pixel layer 200 may further include a driving voltage line. The driving voltage line may be extended to be parallel to the first gate line G1 or to the first data line D1. The driving voltage line may receive the driving voltage ELVdd and be connected to the input terminal N5 of the driving transistor Qd.

The organic light-emitting element LD may include a first electrode AE, an organic layer OL, and a second electrode CE.

The first electrode AE may be an anode electrode or a positive pole. The first electrode AE may be connected to the output terminal N6 of the driving transistor Qd to generate a hole. The second electrode CE may be a cathode electrode or a negative pole. The second electrode CE may receive a common voltage ELVss and may generate an electron. The organic layer OL may be disposed between the first electrode AE and the second electrode CE. The organic layer OL may be made of a plurality of layers and include an organic material.

The hole and electron may respectively be injected from the first electrode AE and the second electrode CE into the organic emissive layer in the organic layer OL. An exciton that may be a bound state of the hole and electron may be formed in the organic emissive layer, which may emit light when the exciton falls from an excited state to a ground state. The intensity of the light emitted from the organic emissive layer may be determined by an output current Id that flows into the output terminal N6 of the driving transistor Qd.

In an embodiment of the present disclosure, the organic layer OL may include two or more organic emissive layers that generate different colors of light.

FIG. 2 illustrates that the second electrode CE is disposed on the first electrode AE. In an embodiment, the positions of the first electrode AE and the second electrode CE may be switched with each other.

The encapsulation substrate 300 may be disposed on the pixel layer 200. The encapsulation substrate 300 may cover the display area DA. The encapsulation substrate 300 may be, for example, an organic layer or an inorganic layer. In an embodiment, the encapsulation substrate 300 may be provided as a substrate made of glass or plastic.

The organic light-emitting display apparatus 1000 may further include a sealing member 310. The sealing member 310 may be disposed to surround the display area DA and connect the substrate 100 and the encapsulation substrate 300. The sealing member 310 may block the organic light-emitting element LD from becoming exposed to external moisture and air, together with the encapsulation substrate 300.

Figure 3:
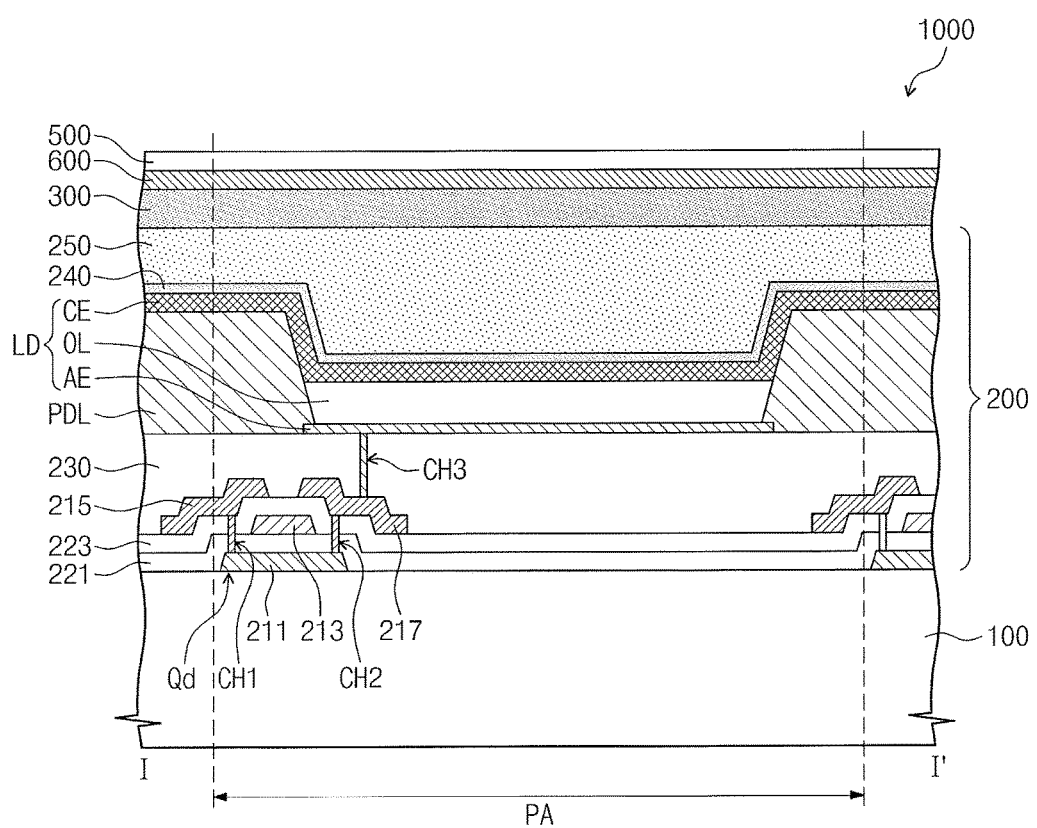
FIG. 3 illustrates a cross-sectional view taken along line I-I' of FIG. 1.
Figure 4:
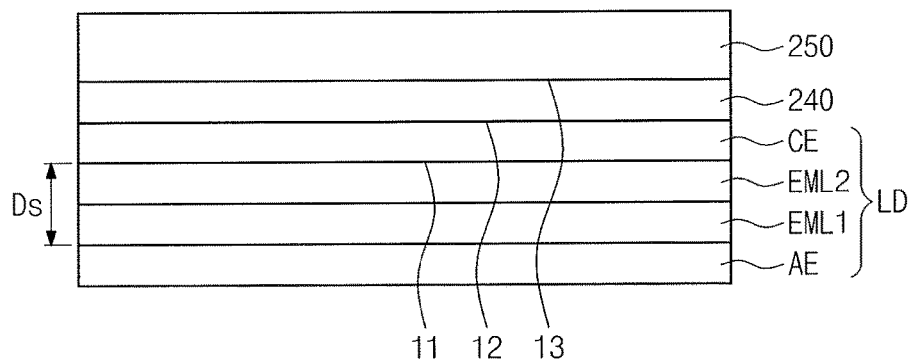
FIG. 4 illustrates a diagram of a stacked structure of an organic light-emitting element, an auxiliary layer, and a charging layer in FIG. 3.

FIG. 3 illustrates a cross-sectional view taken along line I-I' of FIG. 1, and FIG. 4 illustrates a diagram of a stacked structure of an organic light-emitting element, an auxiliary layer, and a charging layer in FIG. 3. FIG. 3 illustrates a cross-sectional view of a single pixel area of an organic light-emitting display apparatus according to an embodiment of the present disclosure.

Referring to FIGS. 3 and 4, the driving transistor Qd may include an active layer 211, a gate electrode 213, a source electrode 215, and a drain electrode 217.

The active layer 211 may be disposed on the substrate 100. The pixel layer 200 may further include a first insulating layer 221 disposed between the active layer 211 and the gate electrode 213. The first insulating layer 221 may insulate the active layer 211 from the gate electrode 213. The source electrode 215 and the drain electrode 217 may be disposed on the gate electrode 213. The pixel layer 200 may further include a second insulating layer 223 disposed between the gate electrode 213 and the source electrode 215 and between the gate electrode 213 and the drain electrode 217. The source electrode 215 and the drain electrode 217 may be connected to the active layer 211 through contact holes CH1 and CH2 on the first insulating layer 221 and the second insulating layer 223, respectively.

FIG. 3 illustrates an exemplary structure of the driving transistor Qd and exemplary positions of the active layer 211, the gate electrode 213, the source electrode 215. In an embodiment, the drain electrode 217 may vary to have various shapes. For example, FIG. 3 illustrates that the gate electrode 213 is disposed on the active layer 211. In an embodiment, the gate electrode 213 may also be disposed under the active layer 211.

The pixel layer 200 may further include a protective layer 230 disposed on the source electrode 215 and the drain electrode 217.

The first electrode AE may be disposed on the protective layer 230. The first electrode AE may be connected to the drain electrode 217 through a contact hole CH3 on the protective layer 230. The first electrode AE may be a pixel electrode or anode. The first electrode AE may be a reflective electrode. The first electrode AE may include silver (Ag), Mg, Al, Pt, Pd, Au, Ni, Nd, Ir, Cr or metallic compounds. The first electrode AE may be a multi-layer structure that may have a plurality of layers made of metal.

The pixel layer 200 may further include a pixel definition layer PDL disposed on the protective layer 230. The pixel definition layer PDL may be disposed to overlap the boundary of the pixel areas PA of FIG. 1 when viewed from the top.

The organic layer OL may include a first organic emissive layer EML1 and a second organic emissive layer EML2. Each of the first and second organic emissive layers EML1 and EML2 may be made of an organic matter having small molecule or macromolecule.

The first organic emissive layer EML1 may emit a first light and the second organic emissive layer EML2 may emit a second light that may have a different color from the first light. The first and second lights may be mixed to generate a white light. For example, the first light may be a blue light and the second light may be a red light and a green light. In an embodiment, the first light may be the blue light and the second light may be a yellow light.

FIG. 4 illustrates that the second organic emissive layer EML2 is disposed on the first organic emissive layer EML1. In an embodiment, the positions of the first and second organic emissive layers EML1 and EML2 may be switched with each other.

The organic layer OL may further include a charge generation layer disposed between the first and second organic emissive layers EML1 and EML2. When a voltage is applied to the first electrode AE and the second electrode CE, the charge generation layer may inject an electron into the first organic emissive layer EM1 and inject a hole into the second organic emissive layer EML2. In an embodiment, the charge generation layer may be omitted and the first and second organic emissive layers EML1 and EML2 may be in direct contact with each other.

The organic layer OL may selectively include a hole transport layer (HTL), a hole injection layer (HIL), an electron transport layer (ETL) and an electron injection layer (EIL), in addition to the first and second organic emissive layers EML1 and EML2.

The second electrode CE may be disposed on the organic layer OL. The second electrode CE may be a common electrode or a cathode. The second electrode CE may be a transmissive or semi-transmissive electrode. The second electrode CE may include Ag. The second electrode CE may be made of Ag or include compounds of Ag and other materials. The other materials may be Li, Ca, LiF/Ca, LiF/Al, Al, Mg, BaF, or Ba for example. Ag may have relatively low absorptance with respect to an incident light. The organic emissive layer LD of the present disclosure may have the second electrode CE having 50% or more Ag content, and may be enhanced in transmissivity.

The thickness of the second electrode CE may be smaller than or equal to about 100 Å. When the thickness of the second electrode CE exceeds 100 Å, there may be a limitation in that the transmissivity of the first and second lights may be low, and the luminance of the organic light-emitting display apparatus 1000 may become low.

The second electrode CE may include an auxiliary electrode. The auxiliary electrode may include a layer formed through deposition, the material may face the emissive layer, and transparent metallic oxide on the layer, such as indium tin oxide (ITO), indium zinc oxide (IZO), zinc oxide (ZnO), and indium tin zinc oxide (ITZO), and may also include, for example, one or more of Mo or Ti.

The first electrode AE may be a reflective electrode and the second electrode CE is provided as a transmissive or semi-transmissive. In an embodiment of the present disclosure, the organic light-emitting element LD may be of a top light-emitting type.

The pixel layer 200 may further include an auxiliary layer 240 and a charging layer 250.

The auxiliary layer 240 may be disposed on the second electrode CE and in contact with the second electrode CE. The auxiliary layer 240 may be made of a transmissive or semi-transmissive material in order to transmit the light passing through the second electrode CE. The thickness of the auxiliary layer 240 may be about 280 Å to about 400 Å. The auxiliary layer 240 may have a refractive index equal to or higher than about 2.2. The auxiliary layer 240 may be made of various materials having the refractive index equal to or higher than about 2.2, such as copper iodide (CuI).

The charging layer 250 may be filled in the space formed by the encapsulation substrate 300, the auxiliary layer 240, and the sealing member 310. The charging layer 250 may be made of a transmissive or semi-transmissive insulating material. The refractive index of the charging layer 250 may be about 1.5. The charging layer 250 may be in contact with the auxiliary layer 240 and the encapsulation substrate 300.

When the organic light-emitting display apparatus 1000 is large, the cell gap between the substrate 100 and the encapsulation substrate 300 may not be constantly maintained in a manufacturing process. For example, in the process of manufacturing the large organic light-emitting display apparatus 1000, the organic light-emitting element LD may be damaged.

In an embodiment of the present disclosure, the charging layer 250 may be required between the auxiliary layer 240 and the encapsulation substrate 300 as a necessary component. The space formed by the encapsulation substrate 300, the auxiliary layer 240, and the encapsulation member 310 may not be filled with air or may not be in a vacuum state.

In an embodiment of the present disclosure, the distance Ds between the first electrode AE and the second electrode CE may be the resonance distance of the first light, and the distance Ds between the first electrode AE and the second electrode CE may be different from the resonance distance of the second light. The first light may satisfy a resonance condition and the second light may not satisfy the resonance condition. The organic light-emitting element LD may have a selective resonance structure for the first light and may not have a resonance structure for the second light.

The organic light-emitting element LD may have a resonance structure for the blue light and may not have a resonance structure for the red light and the green light. In an embodiment of the present disclosure, the distance Ds between the first electrode AE and the second electrode CE may have a value of about 3000 Å to about 5000 Å.

The organic light-emitting display apparatus 1000 may further include a polarizer 500 and an adhesive layer 600. The polarizer 500 may perform circular polarization on an incident light. The polarizer 500 may prevent reflection by an external light. The encapsulation substrate 300 may adhere to the polarizer 500 with the adhesive layer 600 therebetween.

Figure 5:
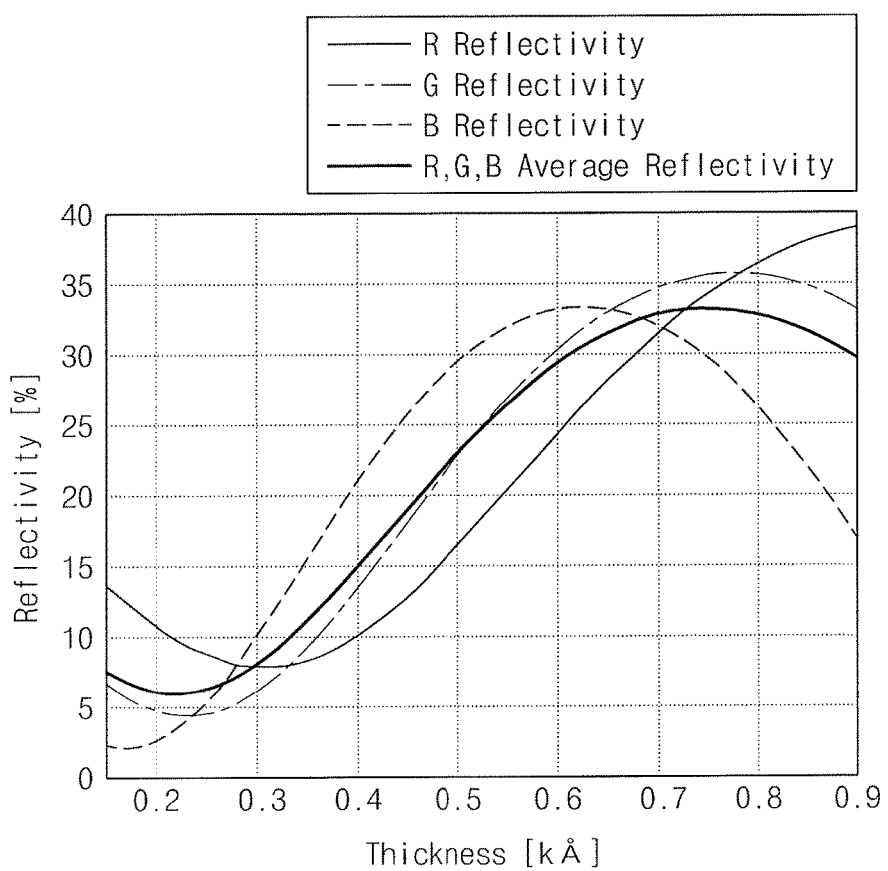
FIG. 5 illustrates a diagram of reflectivity according to the thickness of an auxiliary layer by color of a light.

FIG. 5 illustrates a diagram of reflectivity according to the thickness of an auxiliary layer by color of a light. The simulation condition of FIG. 5 employs copper iodide (CuI) as the auxiliary layer.

Referring to FIG. 4, in an embodiment of the present disclosure, reflectivity is defined as the ratio of lights reflected from the bottom surface 11 of the second electrode CE, the contact surface 12 between the second electrode CE and the auxiliary layer 240, and the top surface of the auxiliary layer 240, among the first and second lights emitted from the first and second organic emissive layers EML1 and EML2.

Red reflectivity is defined as the reflectivity of the red light among the first and second lights, green reflectivity is defined as the reflectivity of the green light among the first and second lights, and blue reflectivity is defined as the reflectivity of the blue light among the first and second lights. Average reflectivity is defined as the average of the red reflectivity, the green reflectivity, and the blue reflectivity.

The thickness of the auxiliary layer 240 may be set to satisfy a condition that the average reflectivity is lower than or equal to about 15% (first condition). When the average reflectivity exceeds about 15%, there may be a limitation in that the transmissivity of the first and second lights is low, and the luminance of the organic light-emitting display apparatus 1000 may become low. When the average reflectivity exceeds about 15%, there may be a limitation in that the red reflectivity and the green reflectivity as well as the blue reflectivity may increase together.

The thickness of the auxiliary layer 240 may be set to satisfy a condition that the blue reflectivity is higher than the red reflectivity and the green reflectivity (second condition). When the blue reflectivity is higher than the red reflectivity and the green reflectivity, the resonance efficiency of the blue light may further increase.

The thickness of the auxiliary layer 240 may be selected within the scope that satisfies both the first condition and the second condition. Referring to FIG. 5, the thickness of the auxiliary layer 240 may be about 280 Å to about 400 Å.

Figure 6:
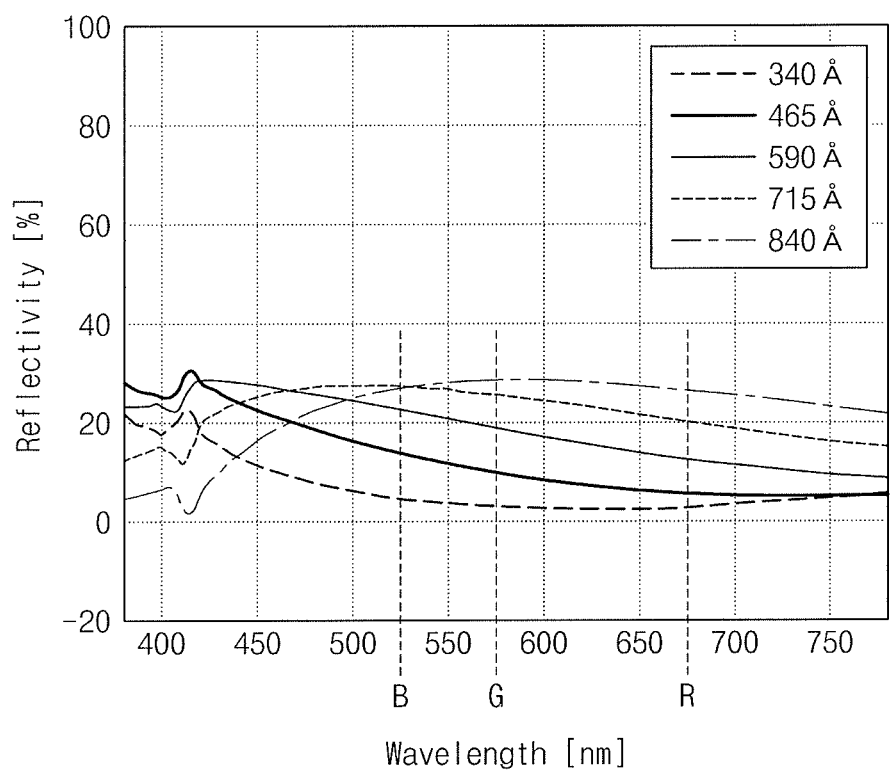
FIG. 6 illustrates a diagram of reflectivity according to a wavelength by thickness of an auxiliary layer.

FIG. 6 illustrates a diagram of reflectivity according to a wavelength by thickness of an auxiliary layer. FIG. 6 illustrates the peak wavelengths of the red light, the green light and the blue light by dotted lines. The simulation condition of FIG. 6 employs copper iodide (CuI) as the auxiliary layer.

Referring to FIGS. 4 to 6, when the thickness of the auxiliary layer 240 is about 460 Å, about 590 Å, about 715 Å, or about 840 Å, the first condition and the second condition may not be satisfied. When the thickness of the auxiliary layer 240 is about 340 Å, the blue reflectivity may be higher than the red reflectivity and the green reflectivity and the average reflectivity may also be lower than or equal to about 15%.

Figure 7:
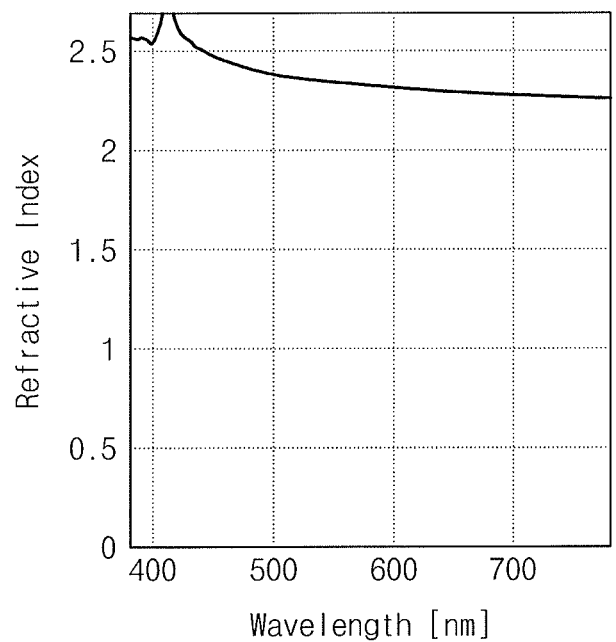
FIG. 7 illustrates a diagram of a change in refractive index according to the wavelength of an auxiliary layer which is applied to a structure for obtaining the result in FIG. 6.

FIG. 7 illustrates a diagram of a change in refractive index according to the wavelength of an auxiliary layer which is applied to a structure for obtaining the result in FIG. 6. The simulation condition of FIG. 7 employs copper iodide (CuI) as the auxiliary layer.

Referring to FIGS. 4 and 7, the refractive index of the auxiliary layer 240 may vary according to a wavelength. The refractive index of the auxiliary layer 240 may be equal to or higher than about 2.2 over all the wavelengths. When the refractive index of the auxiliary layer 240 is equal to or higher than about 2.2 irrespective of the wavelength, the results in FIGS. 5 and 6 may be derived.

Figure 8:
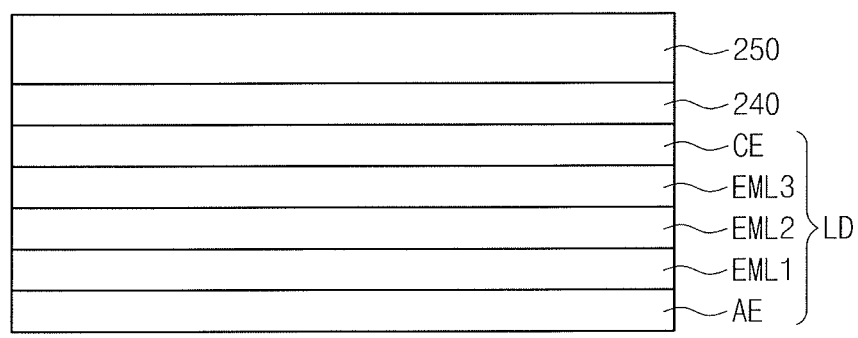
FIG. 8 illustrates a diagram of a stacked structure of an organic light-emitting element, an auxiliary layer, and a charging layer according to an embodiment of the present disclosure.

FIG. 8 illustrates a diagram of a stacked structure of an organic light-emitting element, an auxiliary layer, and a charging layer according to an embodiment of the present disclosure.

The organic light-emitting element LD1 shown in FIG. 8 may include first to third organic emissive layers EML1 to EML3 unlike the organic light-emitting element LD shown in FIG. 4.

The first organic emissive layer EML1 may emit a first light, the second organic emissive layer EML2 may emit a second light different from the first light, and the third organic emissive layer EML3 may emit a third light having a different color from the first light and the second light. The first to third lights may be mixed to generate a white light. For example, the first light may be a blue light, the second light may be a red light, and the third light may be a green light.

FIG. 8 illustrates that the first to third organic emissive layers EML1 to EML3 are sequentially disposed. In an embodiment, the positions of the first to third organic emissive layers EML1 to EML3 may be switched with one another.

In an embodiment, the organic light-emitting element may include four or more organic emissive layers. The lights emitted from the four or more organic emissive layers may be mixed to generate a white light.

By way of summation and review, an organic light-emitting display apparatus may not need a separate light source, unlike a liquid crystal display (LCD) apparatus, and may have a self-luminance characteristic and may decrease in thickness and weight. An organic light-emitting display apparatus may provide high-definition characteristics, such as low power consumption, high luminance, and a quick response speed, and it may be a next generation display apparatus.

The organic light-emitting display apparatus may be of two types. A first type of organic light-emitting display apparatus may include organic light-emitting elements emitting a red light, a green light, and a blue light, respectively and may display images by using the red light, the green light, and the blue light emitted from the organic light-emitting elements, respectively. A second type of organic light-emitting display apparatus may include an organic light-emitting element emitting a white light and a color conversion layer, and provide an appropriate color from the color conversion layer to the white light to display an image.

An embodiment may provide organic light-emitting display apparatuses including a substrate, a first electrode, a second electrode, a first organic emissive layer, a second organic emissive layer, an auxiliary layer, and a charging layer.

Embodiments relate to an organic light-emitting display apparatus that may have a selective resonance structure.

According to an organic light-emitting display apparatus according to an embodiment of the present disclosure, it may be possible to have a resonance structure for a light of a specific wavelength band and have a non-resonance structure at other wavelength bands.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting display apparatus, comprising:
   a substrate;
   a first electrode on the substrate;
   a second electrode on the first electrode;
   a first organic emissive layer between the first electrode and the second electrode, the first organic emissive layer to emit a first light;
   a second organic emissive layer between the first electrode and the second electrode, the second organic emissive layer to emit a second light having a different color from the first light;
   an auxiliary layer on the second electrode, the auxiliary layer having a refractive index equal to or higher than about 2.2; and
   a charging layer on the auxiliary layer.

2. The organic light-emitting display apparatus as claimed in claim 1, wherein a thickness of the auxiliary layer is about 280 Å to about 400 Å.

3. The organic light-emitting display apparatus as claimed in claim 2, wherein the auxiliary layer includes a transmissive or semi-transmissive material.

4. The organic light-emitting display apparatus as claimed in claim 2, wherein the auxiliary layer includes copper iodide.

5. The organic light-emitting display apparatus as claimed in claim 1, wherein the second electrode has a silver content of about 50% or more.

6. The organic light-emitting display apparatus as claimed in claim 5, wherein a thickness of the second electrode is less than or equal to about 100 Å.

7. The organic light-emitting display apparatus as claimed in claim 1, further comprising an encapsulation substrate on the charging layer, wherein the encapsulation substrate covers the first electrode, the first organic emissive layer, the second organic emissive layer, the auxiliary layer, and the charging layer.

8. The organic light-emitting display apparatus as claimed in claim 7, further comprising a polarizer on the encapsulation substrate, wherein the polarizer performs circular polarization on an incident light.

9. The organic light-emitting display apparatus as claimed in claim 1, wherein the first light and the second light are mixed to generate a white light.

10. The organic light-emitting display apparatus as claimed in claim 9, wherein the first light is a blue light and the second light includes a red light and a green light.

11. The organic light-emitting display apparatus as claimed in claim 10, wherein average reflectivity of red, green, and blue from a bottom surface of the second electrode, a contact surface between the second electrode and the auxiliary layer, and a top surface of the auxiliary layer is less than or equal to about 15%.

12. The organic light-emitting display apparatus as claimed in claim 11, wherein reflectivity of the blue from the bottom surface of the second electrode, the contact surface between the second electrode and the auxiliary layer, and the top surface of the auxiliary layer is higher than reflectivity of each of the red and the green from the bottom surface of the second electrode, the contact surface between the second electrode and the auxiliary layer, and the top surface of the auxiliary layer.

13. The organic light-emitting display apparatus as claimed in claim 1, wherein the first light is a blue light and the second light is a yellow light.

14. The organic light-emitting display apparatus as claimed in claim 1, wherein:
the first electrode is an anode and the second electrode is a cathode, and
a portion of the first light and a portion of the second light pass through the second electrode.

15. The organic light-emitting display apparatus as claimed in claim 1, wherein:
a distance between the first electrode and the second electrode is a resonance distance of the first light, and
a distance between the first electrode and the second electrode is different from a resonance distance of the second light.

16. The organic light-emitting display apparatus as claimed in claim 15, wherein the distance between the first electrode and the second electrode is about 3000 Å to about 5000 Å.

17. The organic light-emitting display apparatus as claimed in claim 1, further comprising a charge generation layer between the first and second organic emissive layers.

18. The organic light-emitting display apparatus as claimed in claim 1, further comprising a third organic emissive layer to emit a third light having a different color from the first light and the second light.

19. An organic light-emitting display apparatus, comprising:
a substrate;
a first electrode on the substrate;
a second electrode on the first electrode;
a first organic emissive layer between the first electrode and the second electrode, the first organic emissive layer to emit a first light;
a second organic emissive layer between the first electrode and the second electrode, the second organic emissive layer to emit a second light having a different color from the first light;
an auxiliary layer on the second electrode, the auxiliary layer having a refractive index equal to or higher then about 2.2, the auxiliary layer having a thickness of about 280 Å to about 400 Å;
an encapsulation substrate on the auxiliary layer, the encapsulation substrate covering the first organic emissive layer, the second organic emissive layer, and the auxiliary layer; and
a charging layer between the auxiliary layer and the encapsulation substrate, the charging layer being in contact with the auxiliary layer and the encapsulation substrate.

20. The organic light-emitting display apparatus as claimed in claim 19, wherein:
the second electrode has a silver content of about 50% or more, and
a thickness of the second electrode is less than or equal to about 100 Å.

* * * * *